US010998140B2

(12) United States Patent
Matsuo et al.

(10) Patent No.: US 10,998,140 B2
(45) Date of Patent: *May 4, 2021

(54) SOLAR CELL MODULE

(71) Applicant: ZEON CORPORATION, Tokyo (JP)

(72) Inventors: Takatoshi Matsuo, Tokyo (JP); Yuki Hayashi, Tokyo (JP); Midori Yamaai, Tokyo (JP)

(73) Assignee: ZEON CORPORATION, Tokyo (JP)

(*) Notice: Subject to any disclaimer, the term of this patent is extended or adjusted under 35 U.S.C. 154(b) by 65 days.

This patent is subject to a terminal disclaimer.

(21) Appl. No.: 16/319,912

(22) PCT Filed: Jul. 31, 2017

(86) PCT No.: PCT/JP2017/027777
§ 371 (c)(1),
(2) Date: Jan. 23, 2019

(87) PCT Pub. No.: WO2018/025823
PCT Pub. Date: Feb. 8, 2018

(65) Prior Publication Data
US 2019/0244766 A1    Aug. 8, 2019

(30) Foreign Application Priority Data
Aug. 2, 2016    (JP) .............................. JP2016-152195

(51) Int. Cl.
*H01G 9/20*    (2006.01)
*H01L 51/52*    (2006.01)
(Continued)

(52) U.S. Cl.
CPC .............. *H01G 9/2022* (2013.01); *H01G 9/20* (2013.01); *H01G 9/2031* (2013.01);
(Continued)

(58) Field of Classification Search
CPC ...... H01G 9/2022; H01G 9/20; H01G 9/2031; H01G 9/2077; H01L 31/048; H01L 51/444; H01L 51/5253
See application file for complete search history.

(56) References Cited

U.S. PATENT DOCUMENTS 6,413,645 B1    7/2002    Graff et al.
6,664,623 B1    12/2003   Phani et al.
(Continued)

FOREIGN PATENT DOCUMENTS

CN    102047496 A    5/2011
JP    S5312953 B2    5/1978
(Continued)

OTHER PUBLICATIONS

Mar. 26, 2020, the Extended European Search Report issued by the European Patent Office in the corresponding European Patent Application No. 17836928.6.
(Continued)

*Primary Examiner* — Jayne L Mershon
(74) *Attorney, Agent, or Firm* — Kenja IP Law PC (57) ABSTRACT

A solar cell module (100) includes: one or more cells that are enclosed by a barrier packaging material (13A, 13B) and that include first and second base plates (3, 7) and a functional layer; and first and second lead-out electrodes (11A, 11B) that are respectively connected to electrodes (2, 6) disposed at the sides of the respective base plates (3, 7) via electrical connectors (12A, 12B). The electrical connectors (12A, 12B) are separated from the functional layer in a base plate surface direction. The lead-out electrodes (11A, 11B) are disposed on an outer surface of the barrier packaging material (13A, 13B). Gaps between the barrier packaging material (13A, 13B) and the lead-out electrodes (11A, 11B) are sealed by a lead-out electrode seal (15).

11 Claims, 4 Drawing Sheets

(51) Int. Cl.
  *H01L 31/048* (2014.01)
  *H01L 51/44* (2006.01)
  *H01L 31/02* (2006.01)

(52) U.S. Cl.
  CPC ..... *H01G 9/2077* (2013.01); *H01L 31/02013* (2013.01); *H01L 31/048* (2013.01); *H01L 51/444* (2013.01); *H01L 51/448* (2013.01); *H01L 51/5253* (2013.01); *Y02E 10/549* (2013.01)

(56) References Cited

U.S. PATENT DOCUMENTS

| | | |
|---|---|---|
| 2004/0046497 A1 | 3/2004 | Schaepkens et al. |
| 2004/0058157 A1 | 3/2004 | Ishikawa |
| 2006/0226517 A1 | 10/2006 | Iwanaga et al. |
| 2007/0125420 A1 | 6/2007 | Ezure et al. |
| 2008/0318049 A1 | 12/2008 | Hata et al. |
| 2011/0120550 A1* | 5/2011 | Okada .................. H01G 9/2095 136/256 |
| 2012/0126356 A1 | 5/2012 | Iwabuchi et al. |
| 2014/0261630 A1* | 9/2014 | Morgan .................. H02S 20/32 136/246 |

FOREIGN PATENT DOCUMENTS

| | | |
|---|---|---|
| JP | S58217344 A | 12/1983 |
| JP | 2000323273 A | 11/2000 |
| JP | 2001205743 A | 7/2001 |
| JP | 2002541641 A | 12/2002 |
| JP | 2003206361 A | 7/2003 |
| JP | 2004025732 A | 1/2004 |
| JP | 2006263989 A | 10/2006 |
| JP | 2007030387 A | 2/2007 |
| WO | 2006011655 A1 | 2/2006 |
| WO | 2011148930 A1 | 12/2011 |

OTHER PUBLICATIONS

Feb. 5, 2019, International Preliminary Report on Patentability issued in the International Patent Application No. PCT/JP2017/027777.

J.D.Affinito et al., A new method for fabricating transparent barrier layers, Thin Solid Films, 1996, pp. 63-67, vol. 290-291.

* cited by examiner

SOLAR CELL MODULE

TECHNICAL FIELD

The present disclosure relates to a solar cell module.

BACKGROUND

In recent years, solar cells have been attracting interest as photoelectric conversion elements that convert light energy to electrical power. Among solar cells, those in which resin films are used as substrates benefit from having light weight and flexibility. Examples of solar cells in which resin films are used as substrates include dye-sensitized solar cells, organic thin-film solar cells, and perovskite solar cells. These solar cells normally have a cell structure in which a functional layer that contributes to electron or hole transfer is sandwiched between two electrodes. More specifically, in the case of a dye-sensitized solar cell, the solar cell includes an electrolyte layer as a functional layer. Moreover, in the case of an organic thin-film solar cell or a perovskite solar cell, the solar cell includes a donor layer and an acceptor layer as functional layers.

A solar cell is normally used in the form of a solar cell module that includes one or more cells and lead-out electrodes that are respectively connected to two electrodes, or in the form of a solar cell array in which multiple solar cell modules are connected in series or parallel.

In regards to dye-sensitized solar cell modules, which are one type of solar cell module, it has been proposed that electrical connection is made between the inside and the outside of the module while maintaining a high level of tight sealing. In one example, a solar cell module has been proposed that includes a hole in at least one of a photoelectrode base plate including a photoelectrode and a counter electrode base plate including a counter electrode, and that can be connected to outside of the solar cell module (for example, refer to PTL 1). PTL 1 discloses the insertion of an electrical conductor into a hole formed in at least one of a photoelectrode base plate and a counter electrode base plate and sealing of this hole using a conductive material or a non-conductive material.

CITATION LIST

Patent Literature

PTL 1: JP 2002-541641 A

SUMMARY

Technical Problem

A solar cell module having a structure such as described in PTL 1 is sealed by the conductive material or non-conductive material that is used to fill the hole formed in at least one of the photoelectrode base plate (first base plate) and the counter electrode base plate (second base plate). However, tight sealing of solar cell modules having a structure such as described above has been inadequate. Moreover, infiltration of moisture to the inside of the solar cell module due to, for example, degradation of the conductive material or non-conductive material that is used to fill the hole formed in at least one of the photoelectrode base plate and the counter electrode base plate has been a concern. In the structure disclosed in PTL 1, the hole formed in at least one of the photoelectrode base plate and the counter electrode base plate is in communication with the inside of a cell in which elements that are responsible for power generating function, such as a photoelectrode, an electrolyte layer, and a counter electrode, are enclosed. Therefore, there has been concern that in a situation in which moisture infiltrates into the solar cell module through the hole, the moisture will be able to easily reach the inside of a cell in the module. When a solar cell module having inadequate tight sealing as described above is used in an actual installation environment, photoelectric conversion efficiency of the solar cell module gradually deteriorates, and sufficient photoelectric conversion efficiency cannot be retained. In other words, the solar cell module cannot display an adequate photoelectric conversion efficiency retention rate (hereinafter also referred to simply as "efficiency retention").

Accordingly, an objective of the present disclosure is to provide a solar cell module having an excellent photoelectric conversion efficiency retention rate.

Solution to Problem

As a result of diligent investigation to solve the problem set forth above, the inventors discovered that the use of a barrier packaging material for protecting a cell from the external environment is effective for improving efficiency retention. Moreover, the inventors discovered that efficiency retention of a solar cell module including such a barrier packaging material can be improved by adopting a specific structure in which lead-out electrodes that are respectively connected to a photoelectrode and a counter electrode are disposed at the outer surface of the barrier packaging material.

Accordingly, the present disclosure aims to advantageously solve the problems set forth above by disclosing a solar cell module comprising: one or more photoelectric conversion cells in which a first electrode at a side of a first base plate and a second electrode at a side of a second base plate are in opposition via a functional layer; at least one barrier packaging material that is sealed by a barrier packaging material seal and encloses the one or more photoelectric conversion cells; a first lead-out electrode connected to the first electrode via a first electrical connector; and a second lead-out electrode connected to the second electrode via a second electrical connector, wherein the first connector and the second electrical connector are separated from the functional layer in a base plate surface direction that includes a surface direction of the first base plate and a surface direction of the second base plate, the first lead-out electrode and the second lead-out electrode are disposed on an outer surface of the barrier packaging material that is aligned with the base plate surface direction, and a gap between the barrier packaging material and the first lead-out electrode and a gap between the barrier packaging material and the second lead-out electrode are each sealed by a lead-out electrode seal.

By providing a solar cell module with a barrier packaging material that encloses cells, disposing electrical connectors that are separated from an electrolyte layer in a base plate surface direction on an outer surface of the barrier packaging material, and sealing gaps between the lead-out electrodes and the barrier packaging material in this manner, the photoelectric conversion efficiency retention rate can be improved, the area of the lead-out electrodes can be increased while enclosing cells using the barrier packaging material, and the degree of freedom in connection can be improved.

In the presently disclosed solar cell module, the first base plate and the second base plate preferably each include a resin film. Barrier performance of a substrate itself is poorer with a resin film than with substrates such as glass. However, when base plates of a solar cell module having a structure such as disclosed herein are formed using resin films, it is possible to increase barrier performance and flexibility in a good balance for the solar cell module as a whole, and reduce the weight of the solar cell module.

In the presently disclosed solar cell module, at least part of the first electrical connector and the second electrical connector preferably contains solder. Photoelectric conversion efficiency of the solar cell module can be further increased when at least part of the electrical connectors between the electrodes and the lead-out electrodes is formed using solder.

In the presently disclosed solar cell module, a conductor of the first lead-out electrode and a conductor of the second lead-out electrode are preferably each a metal foil. When the conductors of the lead-out electrodes are metal foils, moisture permeability of parts where these conductors are provided can be suppressed due to high barrier performance of the conductors, and, as a result, efficiency retention can be increased.

In the presently disclosed solar cell module, at least one end of the first lead-out electrode and the second lead-out electrode preferably extends beyond an end of the lead-out electrode seal. When at least one end of the first and second lead-out electrodes is not in contact with the lead-out electrode seal and is not fixed, the degree of freedom in terms of the format of connection of the solar cell module and an external circuit can be improved.

In the presently disclosed solar cell module, in a case in which the first base plate is a photoirradiation-side base plate, at least part of either or both of the second base plate and the barrier packing material at the side of the second base plate is preferably colored. When at least part of the base plate or barrier packaging material at the opposite side to the photoirradiation side is colored, visibility of the lead-out electrodes when the module is viewed from the photoirradiation side can be prevented. Moreover, the incorporation of a colored barrier packaging material can improve aesthetic design and/or improve solar cell characteristics.

In the presently disclosed solar cell module, it is preferable that the at least one barrier packaging material is two barrier packaging materials that are respectively disposed at sides of the first base plate and the second base plate, and the two barrier packaging materials are sealed at the barrier packaging material seal via a frame-shaped body surrounding the photoelectric conversion cells. Sealing of two barrier packaging materials (upper and lower barrier packaging materials) via a frame-shaped body has an effect of inhibiting peeling because curling of ends does not occur compared to a configuration in which barrier packaging materials are adhered via a seal at a peripheral seal. Moreover, by matching the frame-shaped body to the thickness of the module, ease of handling in a subsequent step, such as when combining the module with another member, can be improved because there is no step between a region in the module corresponding to the barrier packaging material seal and other regions in the module.

In the presently disclosed solar cell module, in a case in which: a minimum distance along the barrier packaging material from a contour of the lead-out electrode seal to the first electrical connector or the second electrical connector is taken to be a; and a minimum width of the barrier packaging material seal in the base plate surface direction is taken to be b, a is preferably greater than or equal to b.

The barrier packaging material seal at the periphery does not overlap with the base plate surface in a thickness direction, whereas the lead-out electrode seal does overlap with the base plate surface in the thickness direction. Therefore, it is more difficult to press the lead-out electrode seal than the barrier packaging material seal in sealing. Consequently, the lead-out electrode seal tends to have a larger sealing cross-sectional area and poorer reliability than the barrier packaging material seal. Accordingly, tight sealing of the solar cell module can be further improved, and consequently efficiency retention can be further improved by designing the size, arrangement, and so forth of members of the solar cell module in advance so that the size of the lead-out electrode seal and the size of the barrier packaging material seal satisfy the condition set forth above.

The presently disclosed solar cell module preferably further comprises an adhesive layer disposed in at least part of a gap between the barrier packaging material and either or both of the first base plate and the second base plate. Sealing and efficiency retention of the solar cell module can be further improved when an adhesive layer is interposed between the barrier packaging material and each of the base plates. Moreover, reflection can be suppressed and light transmission into the module can be improved by selecting a material in consideration of the relationship with the refractive index of a substrate.

In the presently disclosed solar cell module, the lead-out electrode seal preferably contains a delayed curing resin. Through use of a delayed curing resin, the lead-out electrode seal can be sufficiently cured in formation of the seal without using a photocurable resin, which requires photoirradiation from the barrier packaging material side or the lead-out electrode side, or a thermosetting resin, which may result in elements being affected by heat.

In the presently disclosed solar cell module, the functional layer may be an electrolyte layer and the solar cell module may be a dye-sensitized solar cell module.

Advantageous Effect

According to the present disclosure, it is possible to provide a solar cell module having a high photoelectric conversion efficiency retention rate.

DETAILED DESCRIPTION

The following provides a detailed description of embodiments of the present disclosure based on the drawings. The presently disclosed solar cell module may, without any specific limitations, be a dye-sensitized solar cell module, an organic thin-film solar cell module, a perovskite solar cell module, or the like. Moreover, the presently disclosed solar cell module may be a solar cell module that includes a plurality of photoelectric conversion cells (hereinafter also referred to simply as "cells") in series connection and may, for example, be a solar cell module having a Z-type integrated structure. Examples of possible integrated structures of the solar cell module besides that of a Z-type module include a series connection structure such as that of a W-type module or a monolithic module, and a parallel connection structure, but are not specifically limited thereto.

Figure 1A:
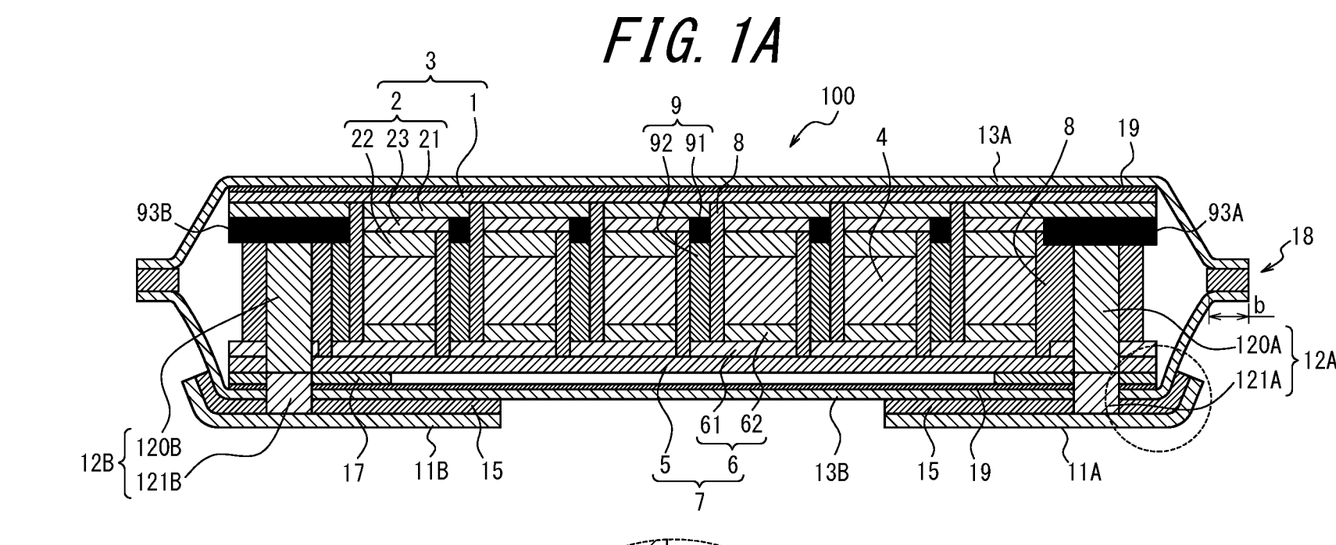
FIG. 1A is a cross-sectional view illustrating schematic structure of a solar cell module according to one embodiment of the present disclosure.
Figure 3:
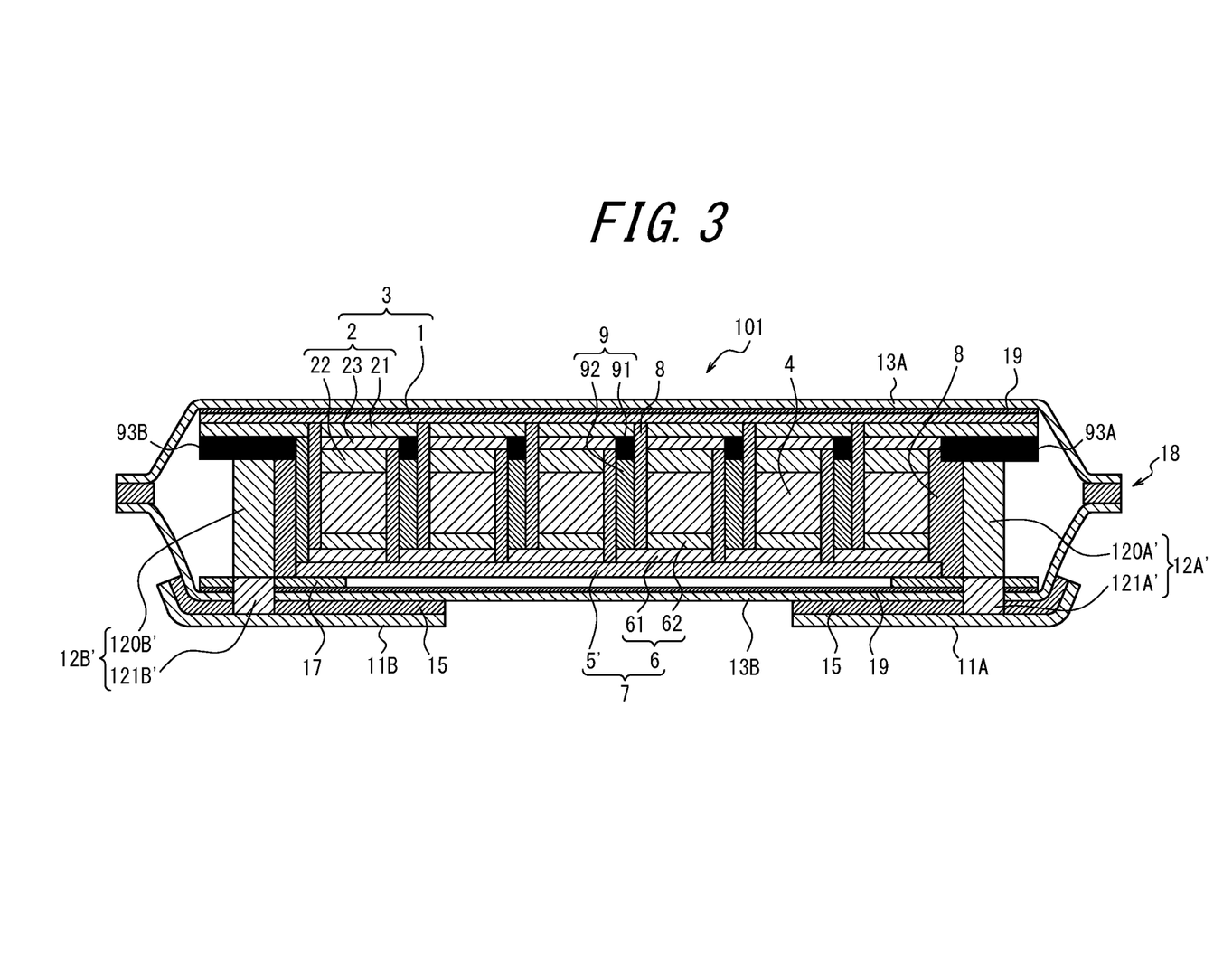
FIG. 3 is a cross-sectional view illustrating schematic structure of a solar cell module according to another embodiment of the present disclosure.
Figure 4:
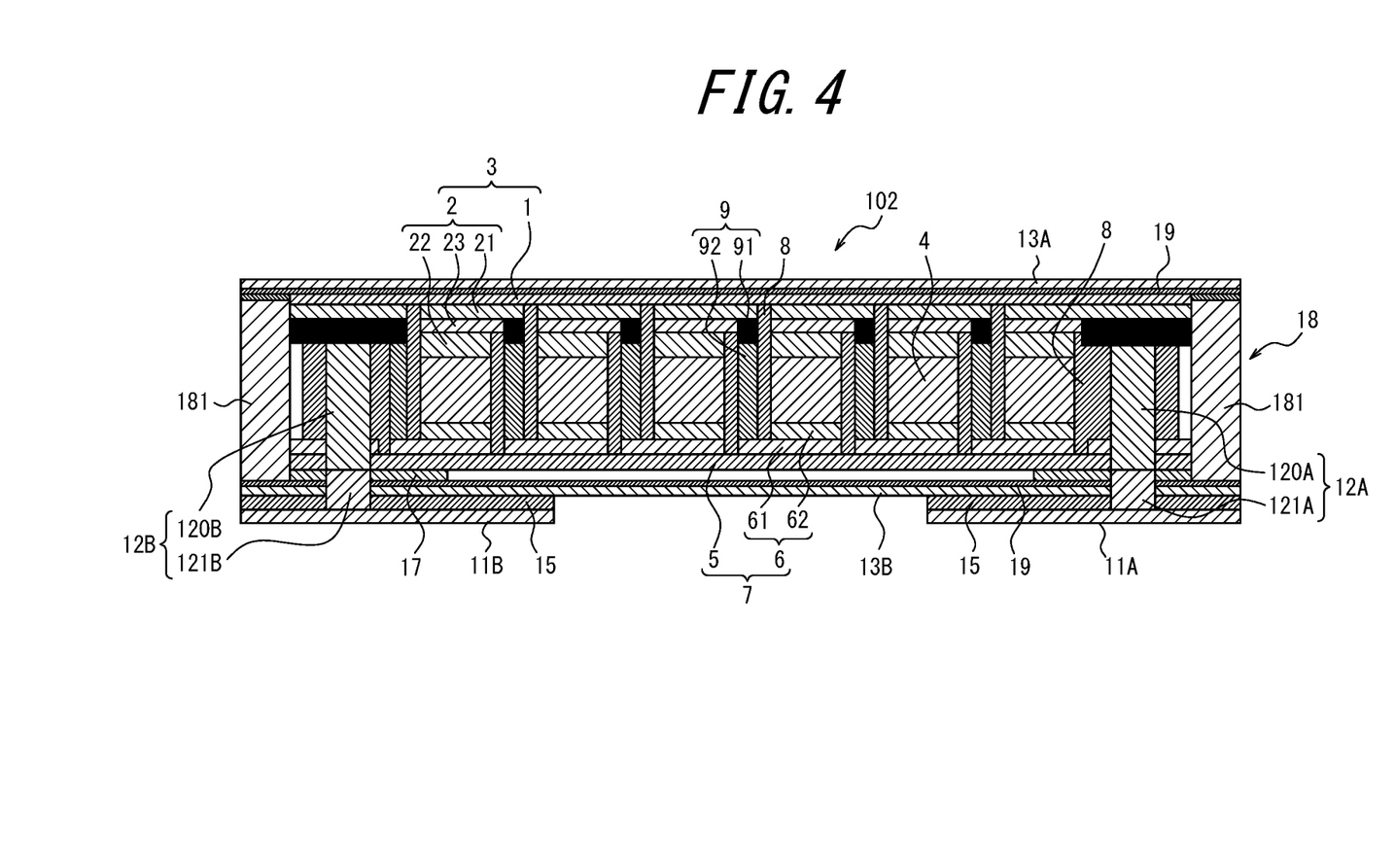
FIG. 4 is a cross-sectional view illustrating schematic structure of a solar cell module according to yet another embodiment of the present disclosure.

Moreover, examples of a dye-sensitized solar cell module having a Z-type integrated structure that is one example of the present disclosure include, but are not specifically limited to, solar cell modules 100 to 102 such as illustrated by cross-sectional views in FIGS. 1A, 3, and 4. The solar cell modules 100 to 102 are dye-sensitized solar cell modules. The following describes each of the solar cell modules 100 to 102.

(Solar Cell Module)

A solar cell module 100 according to one embodiment of the present disclosure that is illustrated by the cross-sectional view in FIG. 1A includes two barrier packaging materials 13A and 13B that cover at least part of a plurality of cells and enclose the plurality of cells. The plurality of cells includes a first base plate (photoelectrode base plate) 3 and a second base plate (counter electrode base plate) 7 that are in opposition via an electrolyte layer (functional layer) 4. More specifically, the barrier packaging materials 13A and 13B cover the entirety of the plurality of cells and are sealed by a barrier packaging material seal 18 such as to enclose the plurality of cells.

The solar cell module 100 also includes a first lead-out electrode 11A that is connected to a photoelectrode conductive layer 21 of a photoelectrode (first electrode) 2 via a first electrical connector 12A and optional current collector wiring 93A (described further below) and a second lead-out electrode 11B that is connected to a counter electrode conductive layer 61 of a counter electrode (second electrode) 6 via a second electrical connector 12B and optional current collector wiring 93B (described further below). The first lead-out electrode 11A and the second lead-out electrode 11B are disposed on an outer surface of the barrier packaging material 13B. Gaps between the barrier packaging material 13B and the first lead-out electrode 11A and between the barrier packaging material 13B and the second lead-out electrode 11B are each sealed by a lead-out electrode seal 15. The first lead-out electrode 11A and the second lead-out electrode 11B are disposed on an outer surface of the barrier packaging material 13B that is aligned with a base plate surface direction.

More specifically, the solar cell module 100 is a dye-sensitized solar cell module including a plurality of cells (six in the illustrated example) that are defined by partitions 8 and are connected in series, and has what is referred to as a "Z-type integrated structure". The solar cell module 100 has a structure in which the first base plate 3 including a first substrate 1 and a plurality of photoelectrodes 2 (six in the illustrated example) disposed on the first substrate 1 with separation between the individual photoelectrodes 2 and the second base plate 7 including a second substrate 5 and a plurality of counter electrodes 6 (six in the illustrated example) disposed on the second substrate 5 with separation between the individual counter electrodes 6 are pasted together in a state with the partitions 8 interposed between the first base plate 3 and the second base plate 7 such that the photoelectrode 2 and the counter electrode 6 of each cell are in opposition via an electrolyte layer 4 (i.e., such that a cell is formed) and such that a cell connector 9 electrically connects the photoelectrode 2 of one cell and the counter electrode 6 of another cell among adjacent cells. Thus, each of the cells of the solar cell module 100 includes a photoelectrode 2, a counter electrode 6 in opposition to the photoelectrode 2, and an electrolyte layer 4 disposed between the photoelectrode 2 and the counter electrode 6.

The first electrical connector 12A and the second electrical connector 12B are separated from the electrolyte layers 4 of the plurality of cells in a base plate surface direction that includes a surface direction of the first base plate 3 and a surface direction of the second base plate 7. In other words, the first electrical connector 12A and the second electrical connector 12B are not disposed in an upward/downward direction (thickness direction of the solar cell module 100) relative to the electrolyte layers 4 (the six electrolyte layers 4 in the illustrated example). Moreover, the first electrical connector 12A and the second electrical connector 12B are not disposed directly adjacent to an electrolyte layer 4 in the base plate surface direction. The first electrical connector 12A is preferably separated from an electrolyte layer 4 by at least a distance corresponding to the thickness of a partition 8. The same applies to the positional relationship of the second electrical connector 12B with an electrolyte layer 4.

<First Base Plate>

The first base plate 3 of the solar cell module 100 illustrated in FIG. 1A includes a first substrate 1 and a plurality of photoelectrodes 2 that is disposed on the first substrate 1 with separation between the individual photoelectrodes 2. The photoelectrodes 2 each include a photoelectrode conductive layer 21 disposed on the first substrate 1 and a porous semiconductor fine particulate layer 22. In addition, an undercoat layer 23 may optionally be disposed on the photoelectrode conductive layer 21 as illustrated in FIG. 1A. In a case in which the subsequently described electrolyte layer 4 is formed by a liquid, electrolyte solution may reach the photoelectrode conductive layer 21 through the porous semiconductor fine particulate layer 22, and an internal short-circuit phenomenon referred to as reverse electron transfer, in which electrons leak from the photoelectrode conductive layer 21 into the electrolyte layer 4, may occur. This may generate a reverse current that is unrelated to photoirradiation and reduce photoelectric conversion efficiency. The internal short-circuit phenomenon can be prevented by providing the undercoat layer 23 on the photoelectrode conductive layer 21. Provision of the undercoat layer 23 on the photoelectrode conductive layer 21 can also improve close adherence between the porous semiconductor fine particulate layer 22 and the photoelectrode conductive layer 21.

Note that photoelectrode conductive layers 21 are disposed with gaps therebetween. Moreover, adjacent photoelectrodes 2 are disposed such as to be electrically insulated from one another. This electrical insulation may be achieved, for example, through partitions 8 that are present in the gaps between adjacent photoelectrode conductive layers 21, but is not specifically limited to being achieved in this manner.

A substrate used as the first substrate 1 may be selected as appropriate from commonly known light-transmitting substrates without any specific limitations. For example, a known transparent substrate that displays transparency in the visible region, such as a transparent resin or glass, may be used as the first substrate 1. Of such substrates, a resin that has been shaped into the form of a film (i.e., a resin film) is preferable as the first substrate 1. This is because the solar cell module can be provided with flexibility, and efficiency retention of the solar cell module can be further increased when a resin film is adopted as the first substrate 1.

Examples of transparent resins that may be used to form a transparent substrate include synthetic resins such as polyethylene terephthalate (PET), polyethylene naphthalate (PEN), syndiotactic polystyrene (SPS), polyphenylene sulfide (PPS), polycarbonate (PC), polyarylate (PAr), polysulfone (PSF), polyester sulfone (PES), polyetherimide (PEI), transparent polyimide (PI), and cycloolefin polymer (COP).

The photoelectrode conductive layer 21 is not specifically limited and may be obtained by forming a conductive layer composed of a metal mesh containing Au, Ag, Cu, or the like, a conductive layer formed through application of metal nanoparticles such as Ag nanoparticles, fine Ag wire, or the like, a conductive layer containing a composite metal oxide such as indium tin oxide (ITO), indium zinc oxide (IZO), or fluorine-doped tin oxide (FTO), a carbon-based conductive layer containing carbon nanotubes, graphene, or the like, or a conductive layer containing a conductive polymer such as PEDOT/PSS (poly(3,4-ethylenedioxythiophene) polystyrene sulfonate). A plurality of such conductive layers may be stacked on a substrate such as resin or glass. Alternatively, various conductive materials such as described above that can be used to form these conductive layers may be mixed and then used to form a single conductive layer.

The terms "conductivity" and "conductive" as used in the present specification mean that electrical connection is possible in at least the direction of connection. The electrical resistance of a member that is "conductive" or displays "conductivity" is preferably as low as possible from a viewpoint of improving solar cell characteristics. In particular, it is preferable that resistance in the electrical connection direction when the member is installed in the solar cell module does not cause significant deterioration of solar cell module characteristics. Specifically, the unit area resistance of a member that is "conductive" or displays "conductivity" is preferably 0.5 $\Omega \cdot cm^2$ or less. The unit area resistance can be determined from a value measured by a resistivity meter at both ends in the electrical connection direction and the cross-sectional area of the member in a direction perpendicular to the connection direction.

The photoelectrode conductive layer 21 may be formed on the first substrate 1 by a known formation method such as a method using a combination of sputtering and etching or a screen printing method.

The porous semiconductor fine particulate layer 22 on which a sensitizing dye is supported (adsorbed) is not specifically limited and may be a porous semiconductor fine particulate layer that is obtained through adsorption of a sensitizing dye such as an organic dye or a metal complex dye by a porous semiconductor fine particulate layer containing particles of an oxide semiconductor such as titanium oxide, zinc oxide, or tin oxide. Examples of organic dyes that may be used include cyanine dyes, merocyanine dyes, oxonol dyes, xanthene dyes, squarylium dyes, polymethine dyes, coumarin dyes, riboflavin dyes, and perylene dyes. Examples of metal complex dyes that may be used include phthalocyanine complexes and porphyrin complexes of metals such as iron, copper, and ruthenium. Representative examples of sensitizing dyes include N3, N719, N749, D102, D131, D150, N205, HRS-1, and HRS-2. It is preferable that an organic solvent in which the sensitizing dye is dissolved is subjected to degassing and purification by distillation in advance in order to remove moisture and gas present in the solvent. Preferable examples of solvents that may be used as the organic solvent include alcohols such as methanol, ethanol, and propanol, nitriles such as acetonitrile, halogenated hydrocarbons, ethers, amides, esters, carbonate esters, ketones, hydrocarbons, aromatics, and nitromethane.

The porous semiconductor fine particulate layer 22 may be formed on the photoelectrode conductive layer 21 or the optional undercoat layer 23 by a known formation method such as screen printing or coating. Moreover, adsorption of the sensitizing dye by the porous semiconductor fine particulate layer may be achieved by a known method such as immersion of the porous semiconductor fine particulate layer in a solution containing the sensitizing dye.

The optional undercoat layer 23 may, without any specific limitations, contain a material that exhibits semiconductor properties and may, for example, be a layer containing a material such as titanium oxide, niobium oxide, or tungsten oxide. The undercoat layer may be formed by a method in which the aforementioned material is directly sputtered onto a transparent conductive layer or a method in which a solution obtained by dissolving the aforementioned material in a solvent, a solution obtained by dissolving a metal hydroxide that serves as a precursor of a metal oxide, or a solution containing a metal hydroxide obtained by dissolving an organometallic compound in a mixed solvent containing water is applied onto the photoelectrode conductive layer 21, dried, and then sintered as necessary.

<Second Base Plate>

The second base plate 7 of the solar cell module 100 includes a second substrate 5 and a plurality of counter electrodes 6 that is disposed on the second substrate 5 with separation between the individual counter electrodes 6. The counter electrodes 6 each include a counter electrode conductive layer 61 disposed on the second substrate 5 and a catalyst layer 62 disposed on part of the counter electrode conductive layer 61. The catalyst layer 62 is in opposition to the porous semiconductor fine particulate layer 22 of a photoelectrode 2.

Note that adjacent counter electrodes 6 are disposed such as to be electrically insulated from one another. This electrical insulation may be achieved, for example, through partitions 8 that are present in the gaps between adjacent counter electrodes 6, but is not specifically limited to being achieved in this manner.

The second substrate 5 may be the same type of substrate as the first substrate 1, or may be a substrate that is not transparent such as a foil or plate of titanium, SUS (stainless steel), aluminum, or the like, and that is not corroded by other solar cell members. Of these substrates, a resin film is preferable as the second substrate 5 for the same reasons as for the first substrate 1. Moreover, the second substrate 5 is preferably a substrate in which through holes have been formed in advance by a known method such as laser irradiation at positions corresponding to the current collector wiring 93A and 93B, which are disposed on the first base plate 3 at the ends of the module.

Moreover, it is preferable that at least part of the second substrate 5 is colored. In a case in which a partition or the like is formed from a photocurable resin material, for example, the formation thereof may be hindered by the use of a colored substrate. However, if such hinderance does not occur, a commercially available second substrate that is already colored may be used. Alternatively, a colorless second substrate may be colored using a typical dye to obtain a second substrate that is at least partially colored. Moreover, by carrying out a coloring step after pasting together the module, it is possible to eliminate the influence of a colored substrate in a situation such as described above in which a partition or the like is formed from a photocurable resin material.

The coloring of at least part of any of the elements positioned at the counter electrode side can prevent visibility of the lead-out electrode when the module is viewed from the photoirradiation side thereof and can improve the aesthetic design of the solar cell module through various colorations. Moreover, differences in optical properties dependent on color may be exploited to improve photoelectric conversion characteristics.

The same type of conductive layer as for the photoelectrode conductive layer 21 may be used as the counter electrode conductive layer 61.

The catalyst layer 62 may be any catalyst layer containing a component that can function as a catalyst such as a conductive polymer, a carbon nanostructure, precious metal particles, or a mixture of a carbon nanostructure and precious metal particles.

Examples of conductive polymers that may be used include polythiophenes such as poly(thiophene-2,5-diyl), poly(3-butylthiophene-2,5-diyl), poly(3-hexylthiophene-2,5-diyl), and poly(2,3-dihydrothieno-[3,4-b]-1,4-dioxine) (PEDOT); polyacetylene and derivatives thereof; polyaniline and derivatives thereof; polypyrrole and derivatives thereof; and polyphenylene vinylenes such as poly(p-xylene tetrahydrothiophenium chloride), poly[(2-methoxy-5-(2'-ethylhexyloxy))-1,4-phenylenevinylene], poly[(2-methoxy-5-(3',7'-dimethyloctyloxy)-1,4-phenylenevinylene)], and poly[2-(2',5'-bis(2"-ethylhexyloxy)phenyl)-1,4-phenylenevinylene].

Examples of carbon nanostructures that may be used include natural graphite, activated carbon, artificial graphite, graphene, carbon nanotubes, and carbon nanobuds.

Any precious metal particles that have a catalytic effect may be used without any specific limitations. Commonly known precious metal particles such as platinum metal, palladium metal, or ruthenium metal may be selected for use as appropriate.

The catalyst layer may be formed by a commonly known method that is selected as appropriate without any specific limitations. For example, the catalyst layer may be formed by applying or spraying, onto a conductive film, a mixture that is obtained by dissolving or dispersing a conductive polymer, a carbon nanostructure, precious metal particles, or both a carbon nanostructure and precious metal particles in an appropriate solvent, and then drying the solvent of the mixture. In the case of a carbon nanostructure or precious metal particles, the mixture may further contain a binder. The binder is preferably a polymer that includes a functional group such as a hydroxy group, a carboxyl group, a sulfonyl group, or a phosphate group, a sodium salt of these functional groups, or the like from a viewpoint of carbon nanostructure dispersibility and close adherence with a substrate.

The catalyst layer may contain carbon nanotubes having an average diameter (Av) and a diameter standard deviation ($\sigma$) that satisfy $0.60>3\sigma/Av>0.20$ (hereinafter also referred to as formula (A)). (Hereinafter, these carbon nanotubes are also referred to as "prescribed carbon nanotubes".) It should be noted that the term "prescribed carbon nanotubes" is used herein as a general term for collectively referring to specific carbon nanotubes composing the "prescribed carbon nanotubes" and the term "diameter" is used herein to refer to the external diameter of the specific carbon nanotubes.

The average diameter (Av) and the diameter standard deviation ($\sigma$) of the prescribed carbon nanotubes are respectively a sample average value and a sample standard deviation. These values are determined as an average value and a standard deviation when the diameters of 100 randomly selected carbon nanotubes are measured by observation under a transmission electron microscope. The term "3$\sigma$" in formula (A) is the obtained standard deviation ($\sigma$) multiplied by 3.

A counter electrode having excellent catalytic activity can be obtained through use of the prescribed carbon nanotubes. From a viewpoint of improving characteristics of the obtained counter electrode, it is preferable that $0.60>3\sigma/Av>0.25$, and more preferable that $0.60>3\sigma/Av>0.50$.

$3\sigma/Av$ expresses the diameter distribution of the prescribed carbon nanotubes and a larger value for $3\sigma/Av$ indicates a wider diameter distribution. The diameter distribution preferably takes a normal distribution. In this situation, the diameter distribution can be obtained by measuring the diameters of 100 randomly selected carbon nanotubes that can be observed using a transmission electron microscope, using the results to plot the obtained data with diameter on the horizontal axis and probability density on the vertical axis, and then making a Gaussian approximation. Although a large $3\sigma/Av$ value can be obtained by combining a plurality of types of carbon nanotubes obtained by different production methods, for example, it is difficult to obtain a normal distribution for the diameter distribution in such a situation. The prescribed carbon nanotubes may be a single type of carbon nanotubes or carbon nanotubes obtained by blending a single type of carbon nanotubes with an amount of other carbon nanotubes that does not affect the diameter distribution of the single type of carbon nanotubes.

The prescribed carbon nanotubes may be obtained by a commonly known method. For example, the prescribed carbon nanotubes may be obtained by a method (super growth method) in which, during synthesis of carbon nanotubes through chemical vapor deposition (CVD) by supplying a feedstock compound and a carrier gas onto a substrate (hereinafter also referred to as a "substrate for CNT production") having a catalyst layer for carbon nanotube production (hereinafter also referred to as a "catalyst layer for CNT production") at the surface thereof, a trace amount of an oxidizing agent is provided in the system to dramatically improve the catalytic activity of the catalyst layer for CNT production (for example, WO 2006/011655 A1). Hereinafter, carbon nanotubes produced by the super growth method are also referred to as SGCNTs.

A counter electrode including a catalyst layer having the prescribed carbon nanotubes as a constituent material can be produced by, for example, preparing a dispersion liquid containing the prescribed carbon nanotubes, applying the dispersion liquid onto a substrate, and drying the resultant applied film to form a catalyst layer.

The partitions 8 of the solar cell module 100 are disposed between the first base plate 3 and the second base plate 7 and surround each of the electrolyte layers 4 and the cell connectors 9. In other words, spaces for the electrolyte layers 4 and spaces for the cell connectors 9 are defined by the first base plate 3, the second base plate 7, and the partitions 8.

Specifically, in FIG. 1A, at one side (right side in FIG. 1A) of each cell in the width direction thereof, a partition 8 is disposed between the photoelectrode conductive layer 21 of the photoelectrode 2 of the first base plate 3 and the second substrate 5 of the second base plate 7 and, at the other side (right side in FIG. 1A) of each cell in the width direction thereof, a partition 8 is disposed between the photoelectrode conductive layer 21 of the photoelectrode 2 of the first base plate 3 and the counter electrode conductive layer 61 (part positioned further to the other side in the width direction than a part where the catalyst layer 62 is formed) of the counter electrode 6 of the second base plate 7. The electrolyte layers 4 and the cell connectors 9 are disposed alternately between the partitions 8.

No specific limitations are placed on the partitions 8 so long as they can adhere the first base plate 3 and the second base plate 7 and can seal each of the electrolyte layers 4. It is preferable that the partitions 8 have excellent adhesiveness with the base plates, electrolyte resistance (chemical resistance), and durability under high temperature and high humidity (wet heat resistance). Examples of partition materials that may be used to form such partitions 8 include non-conductive thermoplastic resins, thermosetting resins, and active radiation (light, electron beam) curable resins. More specific examples include (meth)acrylic resins, fluororesins, silicone resins, olefinic resins, and polyamide resins. In the present specification, "(meth)acryl" is used to indicate "acryl" or "methacryl". Of these materials, a photocurable acrylic resin is preferable from a viewpoint of ease of handling.

Note that from a viewpoint of ease of production, it is of course possible to form the partitions 8 using films obtained by shaping various resins such as described above into a sheet-shaped form.

The term "non-conductive" as used in the present specification means having volume resistance such that leakage current that may negatively affect solar cell characteristics does not flow. For example, "non-conductive" may refer to a volume resistance of $10^7$ Ω·cm or more.

<Functional Layer>

Each electrolyte layer 4 serving as a functional layer in the solar cell module 100 is disposed in a space surrounded by a porous semiconductor fine particulate layer 22 of a photoelectrode 2, a catalyst layer 62 of a counter electrode 6, and partitions 8. The electrolyte layer 4 may be formed using any electrolyte solution, gel electrolyte, or solid electrolyte that can be used in a dye-sensitized solar cell without any specific limitations.

The cell connectors 9 of the solar cell module 100 electrically connect adjacent cells in series. Specifically, each of the cell connectors 9 electrically connects the photoelectrode conductive layer 21 of the photoelectrode 2 in a cell positioned on the left side in FIG. 1A to the counter electrode conductive layer 61 of the counter electrode 6 in a cell positioned on the left side in FIG. 1A.

<Cell Connectors>

Each of the cell connectors 9 in the solar cell module 100 includes wiring 91 that is formed on the photoelectrode conductive layer 21 of the photoelectrode 2 and is separated from the porous semiconductor fine particulate layer 22, and a conductive resin composition 92 that is used to fill a space surrounded by the first base plate 3, the second base plate 7, and partitions 8. Note that although each of the cell connectors 9 in the solar cell module 100 illustrated in FIG. 1A is formed using wiring 91 and a conductive resin composition 92, a cell connector in the presently disclosed solar cell module may be formed using just a conductive resin composition. Also, wiring may be formed on the counter electrode conductive layer 61 of the counter electrode 6.

Wiring made from a material having conductivity such as a metal or a metal oxide may be used as the wiring 91 without any specific limitations. In particular, it is preferable to use metal wiring such as copper wiring, gold wiring, silver wiring, or aluminum wiring for the wiring 91 from a viewpoint of lowering resistance of the cell connector 9 and increasing photoelectric conversion efficiency of the dye-sensitized solar cell module. The wiring 91 may be formed on the photoelectrode conductive layer 21 by a known formation method such as sputtering or screen printing.

The conductive resin composition 92 is preferably a composition that contains a resin and conductive particles, but is not specifically limited thereto. Examples of the resin of the conductive resin composition 92 include, but are not specifically limited to, resins that are cured through irradiation with active radiation or ultraviolet rays and resins that are cured through heating. Specific examples of the resin of the conductive resin composition 92 include (meth)acrylic resins; epoxy resins such as bisphenol-type epoxy resins, novolac-type epoxy resins, cyclic epoxy resins, and alicyclic epoxy resins; and silicone resins. Any curing agent such as a radical initiator, a cationic curing agent, or an anionic curing agent may be used in the resin. The form of polymerization of the resin is not specifically limited and may be addition polymerization, ring-opening polymerization, or the like. Moreover, a resin used as a partition material and a resin of the conductive resin composition 92 may be the same type or different types of resin.

Examples of the conductive particles of the conductive resin composition 92 include, but are not specifically limited to, particles of metals such as Ag, Au, Cu, Al, In, Sn, Bi, and Pb and alloys containing any of these metals; metal oxide particles; particles obtained by coating the surfaces of organic compound particles such as resin particles or inorganic compound particles with a conductive substance such as a metal or metal oxide (for example, Au/Ni alloy coated particles); and conductive carbon particles.

The average particle diameter of the conductive particles is preferably at least 0.5 μm and not more than 30 μm. The percentage content of the conductive particles is preferably at least 0.1 volume % and not more than 90 volume %.

The cell connector 9 in which the conductive resin composition 92 described above is used may be formed, for example, by loading an uncured conductive resin composition containing uncured resin and conductive particles at a position where the cell connector 9 is to be formed and then curing the uncured conductive resin composition that has been loaded, but is not specifically limited to being formed in this manner.

The solar cell module 100 preferably includes current collector wiring 93A and 93B disposed at the respective width direction ends (left/right direction in FIG. 1A) of the plurality of cells. One of the current collector wiring 93A and 93B (current collector wiring 93A) is connected to a photoelectrode 2 and the other of the current collector wiring 93A and 93B (current collector wiring 93B) is connected to a counter electrode 6. The photoelectric conversion efficiency of the solar cell module 100 can be further improved through the current collector wiring 93A and 93B. The current collector wiring 93A and 93B may be formed from the same material and by the same formation method as the wiring 91.

<Electrical Connectors>

The first and second electrical connectors 12A and 12B that respectively connect a photoelectrode 2 with the first lead-out electrode 11A and a counter electrode 6 with the second lead-out electrode 11B may be formed using a typical electrical connection material, such as solder or a conductive resin composition, without any specific limitations. Solder that contains tin, silver, copper, bismuth, lead, a flux component, or the like may be used as the solder. The conductive resin composition may be a known composition containing a material having conductivity such as a metal, a metal oxide, or a conductive carbon material and a curable resin that is cured through irradiation with active radiation or ultraviolet rays, or through heating, in the same way as conductive resin compositions that may be used to form the cell connectors 9.

The first and second electrical connectors 12A and 12B may each include a plurality of elements. Specifically, the first electrical connector 12A may include a main part 120A and a connecting part 121A, and the second electrical connector 12B may include a main part 120B and a connecting part 121B. As illustrated in FIG. 1A, each of the main parts 120A and 120B extends in a thickness direction of the cells included in the solar cell module 100 and passes through the first substrate 1 or the second substrate 5. Moreover, the connecting parts 121A and 121B extend such as to respectively connect the main part 120A with the first lead-out electrode 11A and the main part 120B with the second lead-out electrode 11B as illustrated in FIG. 1A.

It is preferable that at least part of the first and second electrical connectors is formed from solder from a viewpoint of increasing photoelectric conversion efficiency by lowering resistance. More specifically, it is preferable that the main parts 120A and 120B of the first and second electrical connectors are formed from solder. It is also preferable that the connecting parts 121A and 121B are formed from solder or a conductive resin composition.

Note that the first and second electrical connectors 12A and 12B may be formed by just the main parts 120A and 120B. Moreover, the order in which the main parts 120A and 120B and the connecting parts 121A and 121B are stacked may be swapped depending on the production method or the like.

No specific limitations are placed on the method by which the first and second electrical connectors 12A and 12B are formed using solder or a conductive resin composition so long as an electrical connection is formed. For example, solder or a conductive resin composition may be directly applied at positions where the first and second electrical connectors 12A and 12B are to be formed, or holes may be formed in the shape of the electrical connectors and then solder or the like may be applied into the resultant holes to form the main parts 120A and 120B. In the structure illustrated in FIG. 1A, the holes are also formed in the second substrate 5. Moreover, as illustrated in FIG. 1A, a non-conductive adhesive 17 is applied around the main parts 120A and 120B that are exposed at an outer surface of the second substrate 5 that faces outside of the cells. Furthermore, the barrier packaging material 13B having through holes formed at positions corresponding to the first and second electrical connectors 12A and 12B is overlapped to obtain through hole parts with cured solder or conductive resin composition in an exposed state at the bottom. The through hole parts are further filled with solder or a conductive resin composition, and then the uncured solder or conductive resin composition that has been loaded therein is cured/solidified to form the connecting parts 121A and 121B. The non-conductive adhesive 17 may be any of the various resins listed as resins that can be used to form the partitions 8, but is not specifically limited thereto.

<Lead-Out Electrodes>

The first lead-out electrode 11A and the second lead-out electrode 11B are disposed on the outer surface of the barrier packaging material 13B. Gaps between the barrier packaging material 13B and the first lead-out electrode 11A and between the barrier packaging material 13B and the second lead-out electrode 11B are sealed by lead-out electrode seals 15. It is preferable that at least one end of the first and second lead-out electrodes 11A and 11B is disposed such as to extend beyond the lead-out electrode seal 15 on the outer surface of the barrier packaging material 13B. In other words, it is preferable that respective ends of the first and second lead-out electrodes 11A and 11B are not fixed relative to the barrier packaging material 13B. When the ends of the first and second lead-out electrodes 11A and 11B are not fixed relative to the barrier packaging material 13B, these free ends can be bent, for example, in order to connect to an external circuit. This can improve the degree of freedom in connection of the solar cell module 100.

The first lead-out electrode 11A and the second lead-out electrode 11B are not specifically limited and may each include a conductor formed from a typical conductive material. The conductor may be a conductor formed from a metal material selected from the group consisting of copper, aluminum, nickel, and iron, or an alloy material including any of these metal materials. Other examples include the conductive adhesives described above. Of these examples, the conductor of the lead-out electrode is preferably a metal foil. An electrode having foil-shaped copper as a conductor is particularly preferable.

The term "metal foil" as used in the present specification refers to a foil-shaped metal of 300 µm or less in thickness.

The lead-out electrode seals 15 are not specifically limited and may be formed using a photocurable resin, a thermosetting resin, a thermoplastic resin, a delayed curing resin, or a two component room temperature curing adhesive. Of these examples, the lead-out electrode seals 15 are preferably formed using a delayed curing resin or a two component room temperature curing adhesive, and are more preferably formed using a delayed curing resin. Through use of a delayed curing resin, the lead-out electrode seals can be sufficiently cured in formation of the seals without using a photocurable resin, which requires photoirradiation from the barrier packaging material side or the lead-out electrode side, or a thermosetting resin, which may result in elements being affected by heat.

The term "delayed curing resin" as used in the present specification refers to a resin that commences delayed curing after being provided with a curing trigger. More sufficient curing can be achieved through heating in curing to a level that does not affect elements. The delayed curing resin may be, but is not specifically limited to, a delayed ultraviolet curable adhesive for which irradiation with ultraviolet rays acts as a curing trigger. The delayed ultraviolet curable adhesive may, for example, be an adhesive that has an epoxy resin as a main component.

The two component room temperature curing adhesive may, for example, be an adhesive that has an epoxy resin or an acrylic resin as a main component.

Moreover, in production, the conductor of the first lead-out electrode 11A and/or the second lead-out electrode 11B may undergo a roughening treatment step or an oxidation treatment step performed with respect to a region that may come into contact with the lead-out electrode seal 15. When a region of the conductor that may come into contact with the lead-out electrode seal 15 is roughened or includes an oxide coating, adhesion with the lead-out electrode seal 15 is strengthened, and tight sealing is improved.

The first lead-out electrode 11A and/or the second lead-out electrode 11B preferably has a surface roughness of at least 0.005 µm and not more than 0.5 µm in at least part of the region that may come into contact with the lead-out electrode seal 15. Moreover, each of the conductors preferably has a surface roughness within the numerical range set forth above over the entirety of the region that may come into contact with the lead-out electrode seal 15. When the surface roughness of each of the conductors in at least part of a region that is in contact with the lead-out electrode seal 15 is at least the lower limit set forth above, the lead-out electrode can be strongly held at the lead-out electrode seal 15, and efficiency retention of the solar cell module 100 can be further improved. Furthermore, when the surface roughness of each of the conductors is not more than the upper limit set forth above, the lead-out electrode seal 15 can sufficiently penetrate irregularities in the surface of the conductor, the lead-out electrode can be strongly held at the lead-out electrode seal 15, and efficiency retention of the solar cell module 100 can be further improved.

The thickness of the lead-out electrode seals 15 is preferably 1 μm or more, and is preferably 250 μm or less, and more preferably 200 μm or less. The minimum width of the lead-out electrode seals 15 in the base plate surface direction can be set as appropriate depending on moisture permeability of the seal material that is used.

A smaller lead-out electrode seal 15 thickness reduces the sealing cross-sectional area and thereby makes it easier to prevent infiltration of water from the outside. On the other hand, if the lead-out electrode seals 15 are too thin, resin may not be able to enter gaps. Also, in a case in which the thickness of the lead-out electrode seal 15 is not more than the size of a constituent material or the like (aggregate, filler, etc.) of the resin forming the seal, stress may act on the barrier packaging material 13B. Consequently, the lead-out electrode seals 15 may more easily peel from the barrier packaging material 13B or the like. Therefore, the thickness of the lead-out electrode seals 15 is preferably selected in accordance with material contained in the lead-out electrode seals 15. Specifically, when the thickness of the lead-out electrode seals 15 is at least the lower limit set forth above, tight sealing of the solar cell module 100 by the lead-out electrode seals 15 can be improved. Moreover, when the thickness of the lead-out electrode seals 15 is not more than any of the upper limits set forth above, the sealing cross-sectional area, which becomes an infiltration path for moisture or the like, is not excessively wide, and reliability can be maintained.

<Barrier Packaging Materials>

The barrier packaging materials enclosing the solar cell module 100 are materials that provide the solar cell module 100 with durability against high temperature and high humidity environmental conditions to which the solar cell module 100 may be exposed. Accordingly, the barrier packaging materials are preferably packaging that acts as a barrier against gases and water vapor. Moreover, it is preferable that at least part of the barrier packaging material 13B at the counter electrode side is colored. This can prevent visibility of the lead-out electrodes from the outside. Moreover, the barrier packaging material 13B can be provided with various colorations to improve the aesthetic design of the solar cell module. Furthermore, differences in optical properties dependent on color may be exploited to improve photoelectric conversion characteristics.

No specific limitations are placed on the form in which the first base plate 3 and the second base plate 7 are enclosed by the barrier packaging materials 13A and 13B. For example, the first base plate 3/second base plate 7 and the barrier packaging material 13A/13B may be in a closely adhered state via an adhesive. Alternatively, the barrier packaging material 13A/13B may enclose the first base plate 3/second base plate 7 with a space therebetween, and this space may be filled with a filler or the like through which water vapor and gases do not easily pass. As illustrated in FIG. 1A, the first base plate 3 and the barrier packaging material 13A disposed at the side of the first base plate 3 may be in a closely adhered state via an adhesive layer 19, and the second base plate 7 and the barrier packaging material 13B disposed at the side of the second base plate 7 may be in a closely adhered state via an adhesive layer 19. Tight sealing of the solar cell module can be further improved through the inclusion of these adhesive layers 19. In particular, in a case in which an adhesive layer 19 is disposed at the side of the first base plate 3 (base plate at photoirradiation side), the presence of the adhesive layer 19 between the barrier packaging material 13A and the first base plate 3 means that an air layer is not present between the barrier packaging material 13A and the first substrate 1 of the first base plate 3. An air layer has a significantly different refractive index to the barrier packaging material 13A and the first substrate 1. This results in large differences in refractive index at interfaces of a "barrier packaging material 13A/air layer/first substrate 1" layered structure. When there are large differences in refractive index at the interfaces, the amount of light that is reflected at these interfaces increases and, as a result, the efficiency with which incident light is utilized cannot be sufficiently improved. By filling between the barrier packaging material 13A and the first substrate 1 with an adhesive layer 19 instead of an air layer, refractive index differences can be reduced, and loss due to interface reflection can be reduced. Moreover, suppression of light reflection can inhibit the occurrence of interference fringes at the solar cell module surface. It is more preferable that a material having a refractive index value that is between the refractive index values of the barrier packaging material 13A and the first substrate 1 is selected as a material forming the adhesive layer 19. A material such as described above may, for example, be selected from the materials listed as partition materials while taking into account the material of the barrier packaging material 13A and the material of the first substrate 1.

Moreover, particularly in a case in which the solar cell module is a dye-sensitized solar cell module, it is preferable that a material having high light transmittance in an absorption wavelength region of the used dye is selected as the material forming the adhesive layer 19.

Examples of fillers through which water vapor and gases do not easily pass include liquid and gel paraffin, silicone, phosphoric acid esters, and aliphatic esters.

The water vapor permeability of the barrier packaging materials 13A and 13B in an environment having a temperature of 40° C. and a relative humidity of 90% (90% RH) is preferably 0.1 $g/m^2/day$ or less, more preferably 0.01 $g/m^2/day$ or less, even more preferably 0.0005 $g/m^2/day$ or less, and particularly preferably 0.0001 $g/m^2/day$ or less.

The total luminous transmittance of the barrier packaging materials 13A and 13B is preferably 50% or more, more preferably 70% or more, and even more preferably 85% or more. The total luminous transmittance can be measured in accordance with JIS K7361-1, for example.

The barrier packaging materials 13A and 13B are preferably each a film that includes a barrier layer having low water vapor and gas permeability on a plastic support. Examples of barrier films having low gas permeability include films obtained through vapor deposition of silicon oxide or aluminum oxide (JP S53-12953 B, JP S58-217344 A), films including an organic-inorganic hybrid coating layer (JP 2000-323273 A, JP 2004-25732 A), films containing an inorganic layered compound (JP 2001-205743 A), films in which inorganic materials are stacked (JP 2003-206361 A, JP 2006-263989 A), films in which organic and inorganic layers are alternately stacked (JP 2007-30387 A; U.S. Pat. No. 6,413,645 B1; Affinito et al., Thin Solid Films, 1996, pages 290 and 291), and films in which organic and inorganic layers are consecutively stacked (US 2004-46497 A).

As illustrated in FIG. 1A, the barrier packaging materials include a barrier packaging material seal 18 at the periphery thereof. The barrier packaging material seal 18 may be formed from any of the partition materials that can be used to form the partitions 8 or any of the same types of resins as the resin of the conductive resin composition 92 without any specific limitations. Although FIG. 1A illustrates an embodiment in which an end of the barrier packaging material seal 18 corresponds to peripheral ends of the barrier packaging materials 13A and 13B, this is not a limitation. For example, the barrier packaging material seal 18 may extend such as to cover the peripheral ends of the barrier packaging materials 13A and 13B. Moreover, the partition material and the resin of the conductive resin composition may be the same as or different from the material forming the barrier packaging material seal 18.

Figure 2:
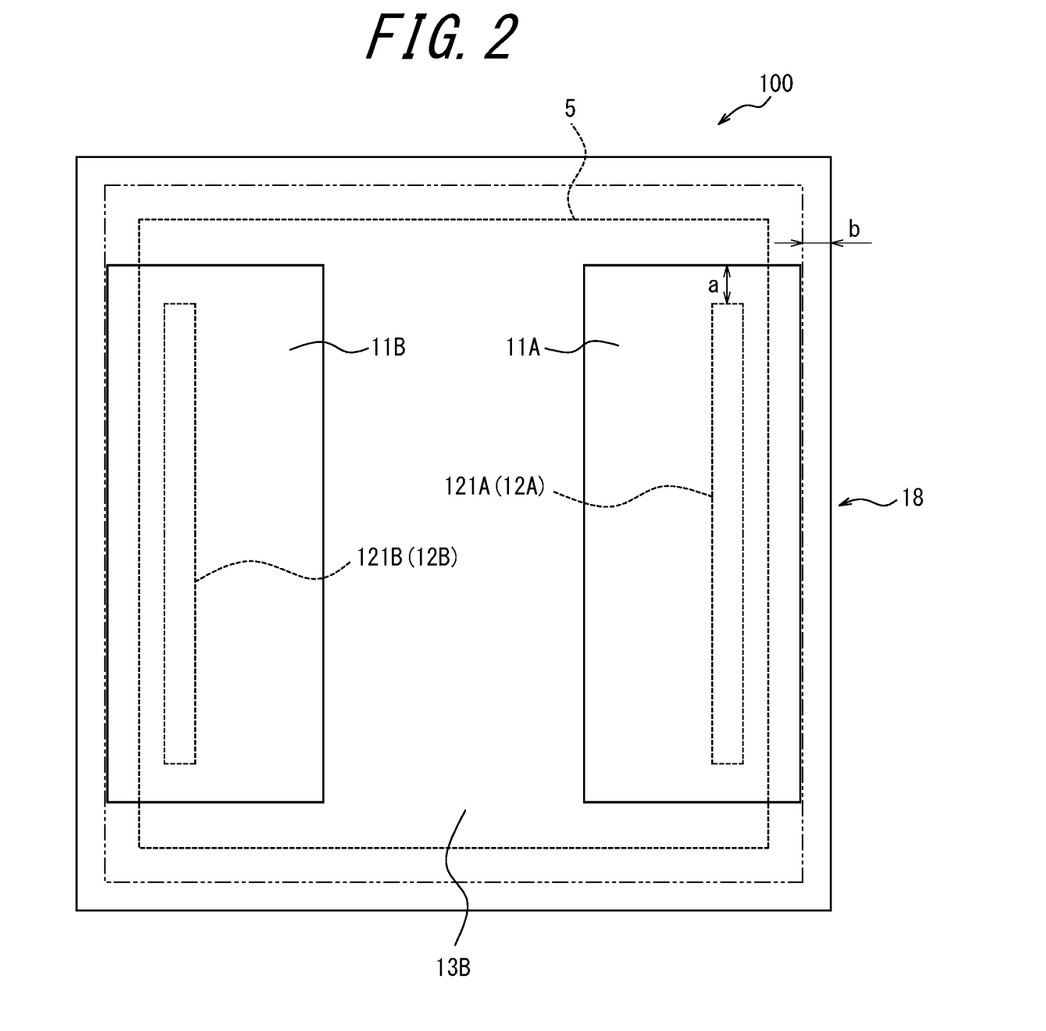
FIG. 2 is a bottom view illustrating schematic structure of the solar cell module illustrated in FIGS. 1A and 1B.

In a case in which the minimum distance along the barrier packaging material 13B between a contour of the lead-out electrode seal 15 and the connecting part 121A of the first electrical connector 12A is taken to be "a" and the minimum width of the barrier packaging material seal 18 in the base plate surface direction is taken to be "b" as illustrated in the bottom view of FIG. 2, it is preferable that a is greater than or equal to b, and more preferable that a is greater than b. The term "contour of the lead-out electrode seal" as used in the present specification refers to a contour defining the outer extent of the lead-out electrode seal 15. The barrier packaging material seal 18 at the periphery does not overlap with the base plate surface in the thickness direction, whereas the lead-out electrode seals 15 do overlap with the base plate surface in the thickness direction. Therefore, it is more difficult to press the lead-out electrode seals 15 than the barrier packaging material seal 18 in sealing. Consequently, the lead-out electrode seals 15 tend to have a larger sealing cross-sectional area than the barrier packaging material seal 18 and tend to have poorer reliability. Therefore, tight sealing of the solar cell module can be further improved by designing the sizes, arrangement, and so forth of members in advance such that the size of lead-out electrode seal and the size of a barrier packaging material seal satisfy the condition set forth above. As a result, efficiency retention can be further improved. A boundary corresponding to an inner end of the barrier packaging material seal 18 is indicated by a two-dot chain line in FIG. 2. Moreover, elements indicated by dashed lines in FIG. 2 are elements that are not directly visible from the bottom surface.

Note that in FIG. 2, the minimum distance a is illustrated as extending in a plane of the barrier packaging material 13B. However, as illustrated in the enlarged view of FIG. 1B, a distance along the barrier packaging material 13B from the contour of the lead-out electrode seal 15 to the connecting part 121A of the first electrical connector 12A that is the shortest of such distances is taken to be the minimum distance a (corresponding to a' illustrated in the enlarged view of FIG. 1B, which is offset downward for clarity) even when the barrier packaging material 13B is uneven.

Figure 1B:
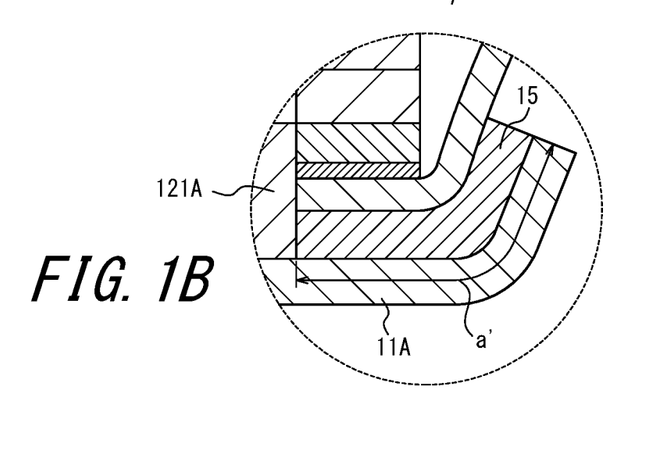
FIG. 1B is an enlarged view of a region including a lead-out electrode of the solar cell module.

<Other Solar Cell Module Structures>
The presently disclosed solar cell module is not limited to the structure set forth above that is illustrated in FIGS. 1A, 1B, and 2, and may, for example, have a structure such as illustrated by the cross-sectional schematic structure in FIG. 3. In FIG. 3, elements that have the same functions as elements of the solar cell module illustrated in FIGS. 1A, 1B, and 2 are indicated by the same reference signs. Moreover, elements that have the same function but differ in terms of shape or positioning are indicated by the same reference sign with an apostrophe (').

As is clear from a solar cell module 101 illustrated in FIG. 3, through holes are not present in a second substrate 5', first and second electrical connectors 12A' and 12B' are disposed in contact with partitions 8 and an outer edge of a second base plate without passing through the second base plate, and these first and second electrical connectors 12A' and 12B' are respectively connected to a first lead-out electrode 11A and a second lead-out electrode 11B.

FIGS. 1A, 1B, 2, and 3 illustrate exemplary structures in which the solar cell modules 100 and 101 include two barrier packaging materials 13A and 13B that are adhered to one another and sealed via an adhesive. However, a solar cell module 102 according to another embodiment of the present disclosure may be sealed via a frame-shaped body 181 as illustrated in FIG. 4. The frame-shaped body 181 surrounds cells. The frame-shaped body 181 and barrier packaging materials 13A and 13B may be adhered to one another via an adhesive. The adhesive is not specifically limited and may be any of the materials that can be used to form the barrier packaging material seal 18. Moreover, the frame-shaped body 181 may be formed, without any specific limitations, from various materials such as any of the resins that can be used to form the previously described partitions 8 or a metal, or from a composite material of such materials. The resin is preferably a resin that is non-conductive and has lower moisture permeability than the material forming the barrier packaging material seal 18. The metal or metal-containing composite material preferably includes a non-conductive coating at the surface. Of such materials, a metal or metal-containing material is preferable as the material forming the frame-shaped body 181 from a viewpoint of reducing moisture permeability. Although the distance between the barrier packaging materials 13A and 13B appears to widen when the frame-shaped body 181 is used, infiltration of moisture into the solar cell module 102 can be inhibited so long as the frame-shaped body 181 has low moisture permeability.

FIGS. 1A, 1B, 2, 3, and 4 illustrate exemplary structures in which the solar cell modules 100 to 102 include a first lead-out electrode 11A and a second lead-out electrode 11B that are both disposed at an outer surface of a barrier packaging material 13B located at the side of a second base plate 7. However, the presently disclosed solar cell module is not limited to these structures and may have a structure including a first lead-out electrode 11A and a second lead-out electrode 11B that are both disposed at an outer surface at the side of a first base plate 3. Moreover, a first lead-out electrode 11A and a second lead-out electrode 11B may of course be disposed at the outer surfaces of barrier packaging materials at different sides to one another.

(Production Method of Solar Cell Module)
The solar cell module 100 having the configuration set forth above can be produced by the following procedure, for example, but is not specifically limited to being produced in this manner. Specifically, a first base plate 3 including photoelectrodes 2 is first produced, and wiring 91 is formed on the produced first base plate 3. Next, an uncured conductive resin composition 92 is applied at positions overlapping with the wiring 91, and then a partition material is applied such as to sandwich the applied conductive resin composition 92 and surround each photoelectrode conductive layer 21. A constituent component of electrolyte layers 4, such as an electrolyte solution, is then used to fill regions where the partition material has been applied. Thereafter, a second base plate 7 including counter electrodes 6 is overlapped with the first base plate 3. Note that through holes are formed in the second base plate 7 in advance at positions corresponding to formation positions of first and second electrical connectors 12A and 12B. The uncured conductive resin composition 92 is cured to form cell connectors 9 and strongly adhere the first base plate 3 and the second base plate 7 to thereby obtain a pair of electrode base plates.

A main part 120A of a first electrical connector 12A and a main part 120B of a second electrical connector 12B are respectively connected to a photoelectrode 2 and a counter electrode 6 included in the obtained pair of electrode base plates (electrical connector main part formation step). The pair of electrode base plates including the obtained main parts 120A and 120B is then packaged in barrier packaging materials (packaging step). A first lead-out electrode 11A and a second lead-out electrode 11B are then connected to the pair of electrode base plates that has been packaged in the barrier packaging materials (lead-out electrode attachment step). Through these steps, the solar cell module 100 having the configuration set forth above can be obtained. The following provides a more detailed description of production from the electrical connector main part formation step to the lead-out electrode attachment step.

<Electrical Connector Main Part Formation Step>

In the electrical connector main part formation step, a main part 120A of a first electrical connector 12A and a main part 120B of a second electrical connector 12B are formed using solder or a conductive resin composition and each of the electrical connectors is connected to the pair of electrode base plates as previously described in the "Electrical connectors" section.

<Packaging Step>

In the packaging step, the pair of electrode base plates that has undergone the electrical connector main part formation step is packaged using barrier packaging materials 13A and 13B. The barrier packaging material 13B used at the outer surface of the second base plate 7 where the main parts 120A and 120B formed in the electrical connector main part formation step are exposed is a barrier packaging material in which through holes have been formed in advance at corresponding positions. Specifically, a non-conductive adhesive is first applied around the main parts 120A and 120B formed in the electrical connector main part formation step at the outer surface of the pair of electrode base plates at the side of the second base plate 7. Next, the barrier packaging material 13B including the through holes is pasted to the application surface such that the positions of the through holes match the positions of the main parts 120A and 120B. In addition, an adhesive serving as a material forming an adhesive layer is applied onto the outer surface at the side of the first base plate 3, and then the barrier packaging material 13A is overlapped with and pasted to the application surface. Application of adhesives may be carried out by typical application means that can be used for adhesive application such as a dispenser method or a screen printing method.

<Lead-Out Electrode Attachment Step>

In the lead-out electrode attachment step, a conductive resin or solder may, for example, be applied onto the surfaces of the main parts 120A and 120B that are exposed at the bottom of the through holes at the side of the barrier packaging material 13B so as to form connecting parts 121A and 121B, and a delayed curing adhesive may be applied onto the surface of the barrier packaging material around the through holes at positions corresponding to lead-out electrode seals 15. Lead-out electrodes 11A and 11B are respectively positioned at the positions corresponding to the lead-out electrode seals 15. The solder or conductive resin and the delayed curing adhesive are then solidified/cured to obtain the solar cell module 100.

Formation of the electrical connectors in accompaniment to attachment of the lead-out electrodes is not limited to the method set forth above and may, for example, be carried out by any of the methods listed below. In the following description, the term "main part" is used as a term indicating a region constituting the majority of the volume of an electrical connector and the term "connecting part" is used as a term indicating a region other than the main part that forms the electrical connector.

Although the following provides examples in which each electrical connector is formed by one layer or two layers, so long as an electrical connector can be formed, the electrical connector may be formed by any method without being limited to the following examples of methods. Moreover, each electrical connector may be formed through stacking of three or more layers. The term "layers" used with respect to an electrical connector refers to parts of the electrical connector that are composed by members that differ in terms of material or formation timing. In a case in which a solder-containing material is used as a material forming an electrical connector, close adherence with the side that is connected to can be improved and resistance can be lowered by melting the material through heating as necessary.

(1) A method in which an electrical connector is formed by forming a main part on either base plate, forming a connecting part on a lead-out electrode, and electrically connecting the main part and the connecting part during attachment of the lead-out electrode (2) A method in which an electrical connector is formed by applying a conductive resin onto either base plate as the electrical connector, positioning a lead-out electrode on the conductive resin, and curing the conductive resin once an electrical connection has been formed (3) A method in which an electrical connector is formed by applying solder onto either base plate as the electrical connector and then positioning a lead-out electrode on the solder (4) A method in which an electrical connector is formed by applying a conductive resin onto a lead-out electrode and then curing the resin once an electrical connection has been formed in positioning of the lead-out electrode (5) A method in which solder is applied onto a lead-out electrode and an electrical connection is formed in positioning of the lead-out electrode (6) A method in which an electrical connector is formed by forming a main part on a lead-out electrode, applying a material for forming a connecting part onto the main part, positioning the lead-out electrode, and then performing curing/solidification Depending on the material that is used, heating or pressing may be performed as necessary in a case in which such heating or pressing is expected to lower resistance. Moreover, the timing at which formation of an electrical connector on a base plate is carried out may be before or after packaging of the module using a barrier packaging material.

Although the production method according to the example described above uses barrier packaging materials that do not include lead-out electrodes, a barrier packaging material to which a lead-out electrode has been closely adhered in advance may of course be used in production of the solar cell module. In such a situation, the method by which a connecting part is formed may be a method that is selected as appropriate depending on used materials and so forth from the examples of connecting part formation methods described above, such as a method in which a connecting part is formed on a lead-out electrode positioned on a barrier packaging material in advance of the barrier packaging material being pasted to the outer surface of a second base plate at which a main part is exposed in the packaging step or a method in which connection with a lead-out electrode is achieved through only an electrical connector formed on a base plate.

EXAMPLES

The following provides a more specific description of the present disclosure based on examples. However, the present disclosure is not limited to the following examples. In the following description, "%" used to express a quantity is by mass, unless otherwise specified.

In the examples and comparative example, efficiency retention of a solar cell module was evaluated by the following method.

<Efficiency Retention of Solar Cell Module>

A solar cell module produced in each example or comparative example was connected to a SourceMeter (Model 2400 SourceMeter produced by Keithley Instruments, Inc.). A solar simulator (PEC-L11 produced by Peccell Technologies, Inc.) having an AM1.5G filter attached to a 150 W xenon lamp illumination device was used as an illuminant. The illuminant was adjusted to an intensity of 1 sun (approximately 100,000 lux AM1.5G, 100 mWcm$^{-2}$ (Class A of JIS C 8912)) and was used to irradiate the solar cell module. The output current of the solar cell module was measured under 1 sun photoirradiation while changing the bias voltage from 0 V to 0.8 V in units of 0.01 V to acquire a current-voltage characteristic. Measurement was performed in the same manner while stepping the bias voltage from 0.8 V to 0 V in the reverse direction. Average values for the forward and reverse directions were taken as photocurrent data. The initial photoelectric conversion efficiency (%) was calculated from the current-voltage characteristic and photocurrent data obtained in this manner.

Next, the dye-sensitized solar cell module was held for 300 hours in an environment of 65° C. and 90% RH, and then a current-voltage characteristic of the solar cell module was measured in the same way as described above. The conversion efficiency was determined in the same way as above, and efficiency retention relative to the initial value was calculated by the following formula.

Efficiency retention (%)=[Conversion efficiency after holding at 65° C. and 90% RH]/[Initial conversion efficiency]×100

Example 1

<Preparation of Dye Solution>

A 200 mL volumetric flask was charged with 72 mg of a ruthenium complex dye (N719 produced by Solaronix). Mixing and agitation with 190 mL of dehydrated ethanol was then performed. The volumetric flask was stoppered and then subjected to 60 minutes of agitation through vibration by an ultrasonic cleaner. The solution was held at normal temperature and then dehydrated ethanol was added to adjust the total volume to 200 mL and thereby obtain a dye solution.

<Production of First Base Plate>

A transparent conductive base plate (sheet resistance: 13 ohm/sq.) obtained by coating a transparent base plate (polyethylene naphthalate film of 200 μm in thickness) serving as a first substrate with a transparent conductive layer (indium tin oxide (ITO)) serving as a photoelectrode conductive layer was subjected to screen printing to print conductive silver paste (K3105 produced by Pelnox Limited) serving as wiring (current collector wiring) at intervals in accordance with photoelectrode cell width. Heating and drying were then performed for 15 minutes in a 150° C. hot air circulation oven to form wiring and current collector wiring (wiring positioned at both ends in continuation direction of wiring; hereinafter, this wiring and current collector wiring are also referred to collectively as "wiring"). The transparent conductive base plate including the obtained wiring was set in a coater with the wiring formation surface thereof facing upward, and a wire bar was used to apply an ORGATIX PC-600 solution (produced by Matsumoto Fine Chemical Co., Ltd.) that had been diluted to 1.6% at a sweep rate of 10 mm/s. The obtained coating was dried for 10 minutes at room temperature and was then further heated and dried for 10 minutes at 150° C. to produce an undercoat layer on the transparent conductive base plate.

Laser processing was performed with respect to the undercoat layer formation surface of the transparent conductive base plate at intervals in accordance with the photoelectrode cell width to form insulated wiring.

In addition, openings (length: 60 mm; width: 5 mm) for porous semiconductor fine particulate layer formation were punched in a mask film obtained through two-stage stacking of protective films each having a pressure-sensitive adhesive layer coated on polyester film (lower stage: PC-542PA produced by Fujimori Kogyo Co., Ltd.; upper stage: NBO-0424 produced by Fujimori Kogyo Co., Ltd.). The processed mask film was pasted to the current collector wiring formation surface of the transparent conductive base plate on which the undercoat layer had been formed such that air bubbles did not enter therebetween. Note that the aim of the first layer of the mask film was to prevent adhesion of dye at unnecessary locations and the aim of the second layer of the mask film was to prevent adhesion of porous semiconductor fine particles at unnecessary locations.

A high-pressure mercury lamp (rated lamp power: 400 W) illuminant was positioned at a distance of 10 cm from the mask pasting surface. Straight after 1 minute of irradiation with electromagnetic waves, titanium oxide paste (PECC-001-06 produced by Peccell Technologies, Inc.) was applied using a Baker-type applicator. The paste was dried for 10 minutes at normal temperature and then the upper protective film (NBO-0424 produced by Fujimori Kogyo Co., Ltd.) of the mask film was removed by peeling. Heating and drying were performed for 5 minutes in a 150° C. hot air circulation oven to form porous semiconductor fine particulate layers (length: 60 mm; width: 5 mm).

Thereafter, the transparent conductive base plate on which the porous semiconductor fine particulate layers (length: 60 mm; width: 5 mm) had been formed was immersed in the prepared dye solution (40° C.) and adsorption of dye was carried out under gentle agitation. After 90 minutes had passed, the titanium oxide films to which the dye had adsorbed were removed from the dye adsorption vessel, were washed with ethanol, and were dried, and then remaining mask film was removed by peeling to thereby produce photoelectrodes.

<Production of Second Base Plate>

The conductive surface of a transparent conductive base plate (sheet resistance: 13 ohm/sq.) obtained by coating a transparent base plate (polyethylene naphthalate film of 200 µm in thickness) serving as a second substrate with a transparent conductive layer (indium tin oxide (ITO)) serving as a counter electrode conductive layer was subjected to laser processing at intervals in accordance with platinum film pattern width to form insulated wiring. In addition, through holes were formed by laser processing at positions on the transparent conductive base plate opposing the wiring disposed at both ends of the photoelectrode-side base plate (i.e., the current collector wiring). Next, a metal mask in which openings (length: 60 mm; width: 5 mm) had been punched was overlapped, and sputtering was performed to form a platinum film pattern (catalyst layers) and thereby obtain a second base plate having light transmittance of approximately 72% in catalyst layer formation parts thereof. The porous semiconductor fine particulate layers and the catalyst layers had structures that matched when the first base plate and the second base plate were overlapped with the conductive surfaces thereof facing one another.

<Production of Dye-Sensitized Solar Cell Module>

A conductive resin composition was prepared by adding Micropearl AU (particle diameter: 8 µm) produced by Sekisui Jushi Corporation to an acrylic resin (TB3035B produced by ThreeBond Holdings Co., Ltd.) serving as a resin material of the conductive resin composition such that the amount of Micropearl AU was 3 mass %, and then performing uniform mixing using a planetary centrifugal mixer.

A vacuum pump was used for fixing the second base plate to a suction plate made from aluminum with the catalyst layer formation surface of the second base plate as a front surface. Next, an automatic application robot was used to apply the conductive resin composition between the catalyst layers as lines at positions that, when in opposition with the first base plate, overlapped with the wiring between the photoelectrode cells, and to apply TB3035B (produced by ThreeBond Holdings Co., Ltd.; absorption wavelength: 200 nm to 420 nm; viscosity: 51 Pa·s) as a liquid ultraviolet curable sealant serving as a partition material at the periphery of the catalyst layers such as to sandwich these lines therebetween. At both ends of the second base plate, TB3035B was applied around the two through holes and also such as to fill to partition formation sites of adjacent cells during this application. Thereafter, a specific amount of electrolyte solution serving as an electrolyte material was applied to catalyst layer parts and then an automatic pasting apparatus was used to perform stacking in a reduced pressure environment such as to obtain a structure in which rectangular catalyst layers and similarly shaped porous semiconductor fine particulate layers faced one another. Photoirradiation with a metal halide lamp was performed from the first base plate side and then photoirradiation was also performed from the second base plate side. Thereafter, connected bodies including a plurality of cells disposed in the pasted together base plates were each cut out, and spaces surrounded by partitions were filled with low temperature solder (CERASOLZER ECO 155 produced by Kuroda Electric Co., Ltd.; melting point: 155° C.) from the through holes in the second base plate such as to achieve electrical continuity with the wiring (current collector wiring) disposed at both ends of the first base plate in the width direction of the plurality of cells, and thereby produce second base plate through wiring serving as main parts of electrical connectors.

Next, a liquid ultraviolet curable non-conductive adhesive (TB3035B produced by ThreeBond Holdings Co., Ltd.) was applied around the through wiring at the second base plate side of the connected body. A barrier film (Ultra-High Barrier Film produced by Neo Seeds Co., Ltd.; water vapor permeability: 0.00005 $g/m^2/day$) that had a surface having a larger area than the surfaces of the first and second base plates and in which openings (through holes) had been formed at positions corresponding to the through wiring was pasted from above while aligning the through wiring and the positions of the openings, and then photoirradiation was performed using a metal halide lamp.

Next, with the first base plate side of the connected body facing upward, TB3035B was applied onto the entire outer surface of the first base plate and the barrier film at the periphery thereof as an adhesive layer forming material and a barrier packaging material seal forming material. Another barrier film was stacked from above and photoirradiation was performed to form a barrier packaging material seal at the peripheries of the upper and lower barrier films and thereby encase the connected body in the barrier films. Note that the minimum width "b" of the barrier packaging material seal in the base plate surface direction was 10 mm.

In addition, the connected body was placed with the second base plate side facing upward, and a normal temperature drying conductive paste (silver paste) DOTITE® (DOTITE is a registered trademark in Japan, other countries, or both; DOTITE D-362 produced by Fujikura Kasei Co., Ltd.) serving as a conductive adhesive was injected with respect to the openings in the barrier film having the through wiring exposed at the bottom to thereby form connecting parts of the electrical connectors. A delayed curing resin (ADEKA ARKLS DL-100-5 produced by Adeka Corporation) was applied onto the barrier film around the openings at positions corresponding to lead-out electrode seals, photoirradiation was performed using a metal halide lamp, and copper foils were stacked as lead-out electrodes. Sealing through curing of the delayed curing resin and formation of electrical connectors through curing of the conductive adhesive were carried out simultaneous on a 60° C. hot plate. The minimum distance "a" from the contour of a lead-out electrode seal to an electrical connector in the obtained solar cell module was 15 mm.

Example 2

A dye-sensitized solar cell module was produced and various measurements and evaluations were carried out in the same way as in Example 1 with the exception that the minimum distance a from a contour of a lead-out electrode seal to an electrical connector was set as 10 mm. The results are shown in Table 1.

Example 3

As illustrated in FIG. 3, through holes were not formed in the second substrate and the width of the second substrate was made narrower than the first substrate such that when stacking was carried out, positions in opposition to the current collector wiring of the ends of the first base plate were located outward of the ends of the second base plate (counter electrode base plate). In formation of partitions, TB3035B was applied at both ends of the second base plate such as to fill to partition formation sites of adjacent cells. Moreover, the through wiring was changed such as to extend outside of the second base plate without passing through the second base plate. With the exception of the above points, a dye-sensitized solar cell module was produced, and various measurements and evaluations were carried out in the same way as in Example 1. The results are shown in Table 1.

Example 4

Prior to production of the dye-sensitized solar cell module, an aluminum frame-shaped body that had been designed to match the height of the solar cell module as illustrated in FIG. 4 was produced.

The pair of electrode base plates obtained through pasting together photoelectrodes and counter electrodes was positioned in a rectangular through hole inside the aluminum frame-shaped body. A scribe line was formed further outward than sections where electrodes and current collector electrodes were formed in order to prevent a short circuit due to contact between the conductive layers on the two electrode substrates and the aluminum frame-shaped body in this positioning.

Thereafter, a liquid ultraviolet curable non-conductive adhesive (TB3035B produced by ThreeBond Holdings Co., Ltd.) was applied onto the photoelectrode-side surface of the pair of base plates surrounded by the frame-shaped body and onto the surface of the frame-shaped body, a barrier film (Ultra-High Barrier Film produced by Neo Seeds Co., Ltd.; water vapor permeability: 0.00005 g/m$^2$/day) of the same size as the area surrounded by the periphery of the first base plate frame-shaped body was pasted thereto, and then photoirradiation was performed with a metal halide lamp.

In addition, the counter electrode side of the solar cell module was placed facing upward and, in the same way as in Example 1, through wiring serving as main parts of electrical connectors was formed, and a barrier film was pasted to the second base plate. Note that a barrier film of the same size as an area surrounded by the periphery of the second base plate frame-shaped body was used as the barrier film that was pasted to the second base plate.

Moreover, in the same way as in Example 1, copper foils were stacked on the second base plate as lead-out electrodes, and sealing through curing of delayed curing resin and formation of electrical connectors through curing of conductive adhesive were carried out simultaneously.

With respect to the obtained solar cell module, a dye-sensitized solar cell module was produced and various measurements and evaluations were carried out in the same way as in Example 1. The results are shown in Table 1.

Comparative Example 1

A non-conductive adhesive (TB3035B produced by ThreeBond Holdings Co., Ltd.) was applied onto the pair of base plates with the exception of positions corresponding to the through wiring serving as electrical connectors passing through the second base plate. The pair of base plates was packaged using a barrier film (Ultra-High Barrier Film produced by Neo Seeds Co., Ltd.; water vapor permeability: 0.00005 g/m$^2$/day) in which openings has been formed at positions corresponding to the through wiring. In other words, the through wiring serving as electrical connectors was used in that form as lead-out electrodes in Comparative Example 1. With the exception of the above points, a dye-sensitized solar cell module was produced, and various measurements and evaluations were carried out in the same way as in Example 1. The results are shown in Table 1.

TABLE 1

|  | Lead-out electrode position | Lead-out electrode seal | Base plate connection wiring position | Barrier packaging material seal | Minimum distance a [mm] | Minimum width b [mm] | Efficiency retention [%] |
| --- | --- | --- | --- | --- | --- | --- | --- |
| Example 1 | On barrier packaging material outer surface | Yes | Through hole | Non-conductive adhesive | 15 | 10 | 100% |
| Example 2 | On barrier packaging material outer surface | Yes | Through hole | Non-conductive adhesive | 10 | 10 | 98% |
| Example 3 | On barrier packaging material outer surface | Yes | Outside of second base plate | Non-conductive adhesive | 15 | 10 | 100% |
| Example 4 | On barrier packaging material outer surface | Yes | Through hole | Frame-shaped body | 15 | 10 | 100% |
| Comparative Example 1 | Combined with electrical connector | No | Through hole | Non-conductive adhesive | — | 10 | 8% |

Examples 1 to 4 demonstrate that a solar cell module in which a barrier packaging material encloses cells, in which electrical connectors that are separated from an electrolyte layer in a base plate surface direction extend along an outer surface of the barrier packaging material, and in which gaps between the lead-out electrodes and the barrier packaging material are sealed has an excellent photoelectric conversion efficiency retention rate. On the other hand, it can be seen that the solar cell module according to Comparative Example 1 in which lead-out electrodes also served as electrical connectors and in which gaps with a barrier packaging material at an outer surface of the barrier packaging material were not sealed had a poor photoelectric conversion efficiency retention rate.

INDUSTRIAL APPLICABILITY

According to the present disclosure, it is possible to provide a solar cell module having an excellent photoelectric conversion efficiency retention rate.

REFERENCE SIGNS LIST

1 first substrate
2 photoelectrode
3 first base plate
4 electrolyte layer 5 second substrate
6 counter electrode
7 second base plate
8 partition
9 cell connector
11A first lead-out electrode
11B second lead-out electrode
12A first electrical connector
12B second electrical connector
13A, 13B barrier packaging material
15 lead-out electrode seal
17 non-conductive adhesive
18 barrier packaging material seal
19 adhesive layer
21 photoelectrode conductive layer
22 porous semiconductor fine particulate layer
61 counter electrode conductive layer
62 catalyst layer
91 wiring
92 conductive resin composition
93A, 93B current collector wiring
100, 101, 102 solar cell module
181 frame-shaped body

The invention claimed is:

1. A solar cell module comprising:
one or more photoelectric conversion cells in which a first electrode at a side of a first base plate and a second electrode at a side of a second base plate are in opposition via a functional layer;
at least one barrier packaging material that is sealed by a barrier packaging material seal and encloses the one or more photoelectric conversion cells;
a first lead-out electrode connected to the first electrode via a first electrical connector; and
a second lead-out electrode connected to the second electrode via a second electrical connector, wherein
the first electrical connector and the second electrical connector are separated from the functional layer in a base plate surface direction that includes a surface direction of the first base plate and a surface direction of the second base plate,
the first lead-out electrode and the second lead-out electrode are disposed so as to be parallel with the base plate surface direction on an outer surface of the barrier packaging material that is aligned with the base plate surface direction,
a gap between the barrier packaging material and the first lead-out electrode and a gap between the barrier packaging material and the second lead-out electrode are each sealed by a lead-out electrode seal, and the outer surface of the barrier packaging material, where the first lead-out electrode and the second lead-out electrode are disposed, configures an outermost surface of the solar cell module.

2. The solar cell module according to claim 1, wherein the first base plate and the second base plate each include a resin film.

3. The solar cell module according to claim 1, wherein at least part of the first electrical connector and the second electrical connector contains solder.

4. The solar cell module according to claim 1, wherein a conductor of the first lead-out electrode and a conductor of the second lead-out electrode are each a metal foil.

5. The solar cell module according to claim 1, wherein at least one end of the first lead-out electrode and the second lead-out electrode extends beyond an end of the lead-out electrode seal.

6. The solar cell module according to claim 1, wherein, in a case in which the first base plate is a photoirradiation-side base plate, at least part of either or both of the second base plate and the barrier packing material at the side of the second base plate is colored.

7. The solar cell module according to claim 1, wherein the at least one barrier packaging material is two barrier packaging materials that are respectively disposed at sides of the first base plate and the second base plate, and the two barrier packaging materials are sealed at the barrier packaging material seal via a frame-shaped body surrounding the photoelectric conversion cells.

8. The solar cell module according to claim 1, wherein, in a case in which:
a minimum distance along the barrier packaging material from a contour of the lead-out electrode seal to the first electrical connector or the second electrical connector is taken to be a; and
a minimum width of the barrier packaging material seal in the base plate surface direction is taken to be b,
a is greater than or equal to b.

9. The solar cell module according to claim 1, further comprising an adhesive layer disposed in at least part of a gap between the barrier packaging material and either or both of the first base plate and the second base plate.

10. The solar cell module according to claim 1, wherein the lead-out electrode seal contains a delayed curing resin.

11. The solar cell module according to claim 1, wherein the functional layer is an electrolyte layer and the solar cell module is a dye-sensitized solar cell module.

* * * * *